United States Patent
Ohmi et al.

(10) Patent No.: US 6,719,875 B1
(45) Date of Patent: Apr. 13, 2004

(54) PLASMA PROCESS APPARATUS

(75) Inventors: Tadahiro Ohmi, 1-17-301, Komegabukuro 2-chome Aoba-ku, Sendai-shi, Miyagi-ken 980-0813 (JP); Takahisa Nitta, Tokyo (JP); Masaki Hirayama, Miyago-ken (JP); Ryu Kaiwara, Miyago-ken (JP); Kazuhide Ino, Miyago-ken (JP)

(73) Assignees: Tadahiro Ohmi, Miyagi-ken (JP); Kabushiki Kaisha Ultraclean Technology Research Institute, Tokyo (JP)

(*) Notice: Subject to any disclaimer, the term of this patent is extended or adjusted under 35 U.S.C. 154(b) by 0 days.

(21) Appl. No.: 09/365,923

(22) Filed: Aug. 3, 1999

(51) Int. Cl.$^7$ .................... H05H 1/00; C23C 16/00
(52) U.S. Cl. .................... 156/345.47; 156/345.49; 156/345.42; 118/723 E; 118/723 MA
(58) Field of Search .................... 156/345.47, 345.49, 156/345.42; 118/723 E, 723 MA; 204/298.01, 298.39; 315/111.41, 111.21

(56) References Cited

U.S. PATENT DOCUMENTS

| | | | | |
|---|---|---|---|---|
| 5,102,496 A | * | 4/1992 | Savas | 156/643 |
| 5,160,398 A | * | 11/1992 | Yanagida et al. | 156/345 |
| 5,272,417 A | * | 12/1993 | Ohmi | 315/111.21 |
| 5,332,468 A | * | 7/1994 | Engelhardt | 216/71 |
| 5,717,294 A | * | 2/1998 | Sakai et al. | 315/111.41 |
| 5,891,252 A | * | 4/1999 | Yokogawa et al. | 118/723 AN |
| 5,916,820 A | * | 6/1999 | Okumura et al. | 438/694 |
| 5,980,687 A | * | 11/1999 | Koshimizu | 156/345.29 |
| 6,014,943 A | * | 1/2000 | Arami et al. | 118/723 E |
| 6,074,518 A | * | 6/2000 | Imafuku et al. | 156/345 |
| 6,153,068 A | * | 11/2000 | Ohmi et al. | 204/298.06 |
| 6,297,165 B1 | * | 10/2001 | Okumura et al. | 438/710 |
| 2002/0020497 A1 | * | 2/2002 | Ohmi et al. | |

FOREIGN PATENT DOCUMENTS

| | | | | | |
|---|---|---|---|---|---|
| JP | 5842226 A | * | 3/1983 | | H01L/21/205 |
| JP | 5861631 A | * | 4/1983 | | H01L/21/302 |
| JP | 6173331 A | * | 4/1986 | | H01L/21/302 |
| JP | 1283363 A | * | 11/1989 | | C23C/14/22 |
| JP | 3162583 A | * | 7/1991 | | C23C/16/50 |

* cited by examiner

*Primary Examiner*—Parviz Hassanzadel
(74) *Attorney, Agent, or Firm*—Randall J. Knuth

(57) ABSTRACT

The plasma process apparatus is capable of uniformalizing the density of a plasma generated thereby and a self-bias voltage associated therewith. This apparatus include two parallel plates electrodes I and II, one of electrodes I and II being configured for carrying a substrate to be plasma processed. The apparatus further includes a magnetic field applying means for applying a magnetic field horizontal and one-directional to a surface of the substrate. An additional element of the apparatus is a single auxiliary electrode positioned around the periphery of electrode I and having high-frequency power applied thereto. The alignment of the electrodes is such that they define a space where a plasma for use in processing the substrate is to be excited.

9 Claims, 16 Drawing Sheets

Shape of the auxiliary electrode

PLASMA PROCESS APPARATUS

BACKGROUND OF THE INVENTION

1. Field of the Invention

The present invention relates to a plasma process apparatus.

2. Related Art

With the increase in chip size of a DRAM, an MPU and the like, a silicon substrate to be used as their base body trends to be made larger in diameter. Although a process of etching an oxide film or a polysilicon material is one of the most important processes in production of semiconductor devices, an ordinary RIE apparatus of parallel plate type which has been used up to now cannot meet a plasma performance required for processing a fine pattern of 1.0 m or less (for example, a process pressure of 50 m Torr or less, an ion current density of 1 mA/cm$^2$, and an electron density of 1×10 cm$^{-3}$ or more).

In order to solve this problem, a plasma source having a magnetic field introduced into it has been developed and a magnetron plasma etching apparatus using a dipole ring magnet (hereinafter referred as to DRM) has been publicized as an example of an apparatus provided with such a plasma source (see Japanese Patent Laid-Open Publication No. Hei 6-37,056).

However, the above-mentioned magnetron plasma etching apparatus using a DRM can generate a low-pressure and high density plasma but has a problem that it is difficult to precisely control a plasma generated on a substrate body. That is to say, introducing a horizontal magnetic field onto a substrate body has made it difficult to uniformalize a plasma density on a substrate and uniformalize a self-bias voltage. At the present time, a solution of uniformalizing a plasma density by sloping a magnetic field (Japanese Patent Laid-Open Publication No.Sho 62-21,062) or by turning a magnetic field introduced into a process space (Japanese Patent Laid-Open Publication No.Sho 61-208,223) has been proposed.

However, a solution by a technique according to Japanese Patent Laid-Open Publication No.Sho 62-21,062 has a problem that the optimum value of a sloping magnetic field is varied in case of changing a process pressure or the like. On the other hand, a solution by a technique according to Japanese Patent Laid-Open Publication No.Sho 61-208,223 has a problem that a plasma generated on a substrate body in process is seemingly uniformalized but a mechanism for turning a magnetic field and it is difficult to make a plasma process apparatus small in size as a whole.

In order to solve these problems, a solution technique of uniformalizing a plasma in a uniform horizontal magnetic field by applying a high-frequency electric power to an auxiliary electrode has been disclosed. This technique can uniformalize a plasma by changing a high-frequency power to be applied to an auxiliary electrode even in case of changing a process pressure or the like, and can make a plasma process apparatus small in size since it is not necessary to turn a magnetic field. However, it is necessary to make the distance between a substrate body and the upper electrode be 30 mm or more so as to keep a pressure distribution within a few percents in a plasma process apparatus for processing a substrate body of 300 mm or more in diameter. Since an effect of applying a high-frequency power to an auxiliary electrode does not reach a substrate body at such a distance, it is difficult to uniformalize a plasma.

SUMMARY OF THE INVENTION

An object of the invention is to provide a plasma etching apparatus being capable of uniformalizing the density of a plasma generated on the surface of a substrate body and the self-bias voltage as keeping uniform, the pressure distribution on the substrate body without turning a means for applying a magnetic field and being capable of performing a uniform etching process without a charge-up damage, and provide a, sputtering apparatus being capable of performing a uniform sputtering process generating no stress on a substrate body.

A plasma process apparatus according to the present invention is characterized by a plasma process apparatus provided with two electrodes I and II of parallel plate type and a magnetic field applying means for applying a magnetic field being horizontal and one-directional to a surface which a plasma process is performed onto, wherein an auxiliary electrode is provided around the periphery of one of the two electrodes, a space where a plasma can be excited is provided at the opposite side of said auxiliary electrode to the face facing the other electrode, and a means for applying a high-frequency power to said auxiliary electrode is provided.

According to the present invention, it is possible to. uniformalize the density of a plasma generated on the surface of a substrate body and uniformalize the self-bias voltage as keeping uniform the pressure distribution on the substrate body without turning a magnetic field, and implement a plasma etching process capable of performing a uniform etching process without a charge-up damage on the substrate body and a uniform sputtering film forming process generating no stress on the substrate body.

Description of the Symbols

Figure 1:
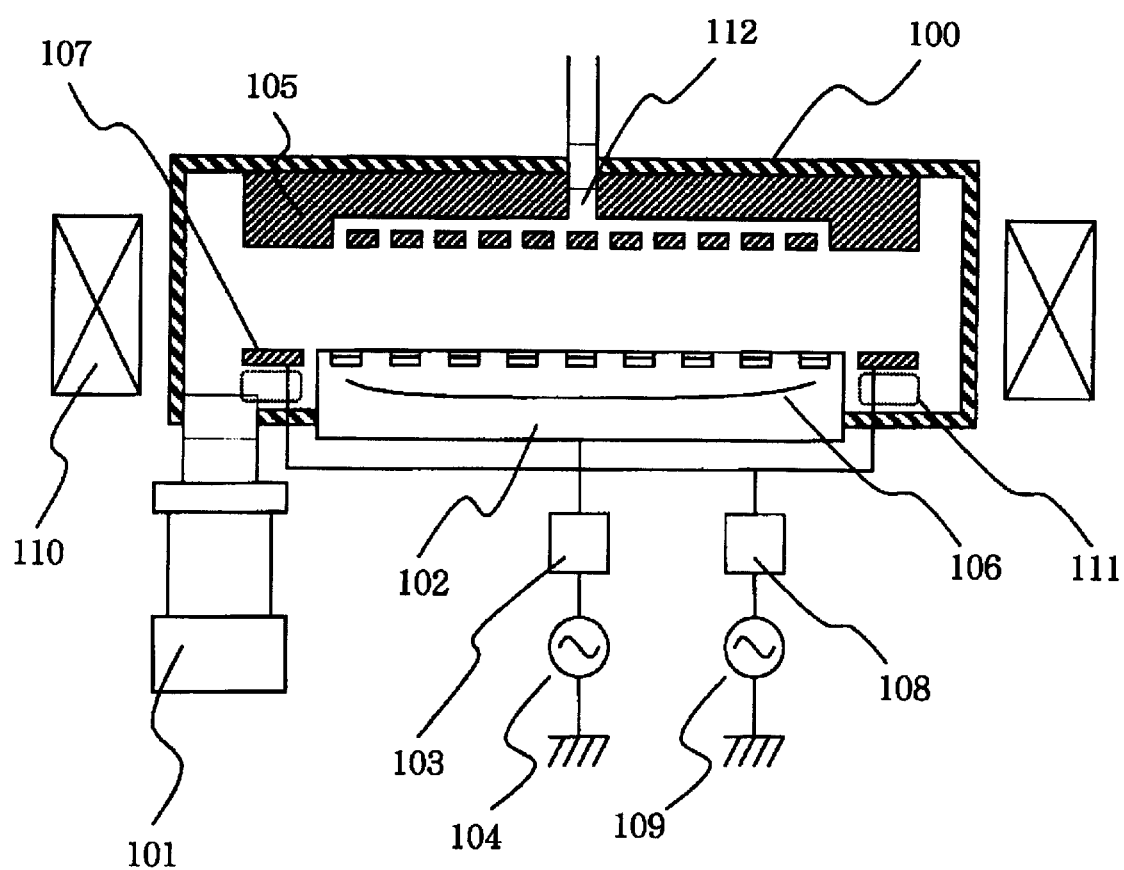
FIG. 1 is a schematic sectional view of a plasma process apparatus according to embodiment 1 of the present invention in which an auxiliary electrode is provided and a space where a plasma can be excited is provided at the opposite side to the face facing electrode II.

100 Chamber
101 Exhausting means
102 Electrode I
103 Matching circuit
104 High-frequency power source .
105 Electrode II
106 Probe
107 Auxiliary electrode
108 Matching circuit
109 High-frequency power source
110 Magnetic field applying means
111 Space where a plasma can be excited
112 Gas introducing means
901 Electrode I
902 Auxiliary electrode
903 High-frequency power source
904 Matching circuit
905 Short-circuit plate
1101 Electrode I
1102 Auxiliary electrode
1103 High-frequency power source
1104 Matching circuit
1105 Capacitor
1300 Magnetic field applying means
1301 Auxiliary electrode
1500 Chamber
1501 Electrode I
1502 Electrode II
1503 Auxiliary electrode
1504 Magnetic field applying means
1505 High-frequency power source
1506 High-frequency power source
1107 Matching circuit
1108 Matching circuit
1509 Substrate to be processed
1510 Gas introducing means
1511 Exhausting mechanism
1700 Chamber
1701 Electrode I
1702 Electrode II
1703 Auxiliary electrode
1704 Magnetic field applying means
1705 High-frequency power source
1706 High-frequency power source
1707 High-frequency power source
1708 Matching circuit
1709 Matching circuit
1710 Matching circuit
1711 Substrate to be processed
1712 Gas introducing means
1713 Exhausting means
1714 Low-pass filter
1715 Direct current power source

DETAILED DESCRIPTION OF THE PREFERRED EMBODIMENTS OF THE INVENTION

Embodiments of the present invention are described with reference to the drawings in the following. The scope of the present invention is not limited to the following embodiments.

Embodiment 1

A plasma process apparatus according to embodiment 1 shown in FIG. 1 is a plasma process apparatus which is provided with two electrodes I 102 and II 105 of parallel plate type and has a substrate body to be processed by means of a plasma on the surface of said electrode I 102 facing said electrode II 105 or on the surface of said electrode II 105 facing said electrode I 102 and which is provided with a magnetic field applying means 110 (dipole ring magnet) for applying a magnetic field being horizontal and one-directional to the surface of said substrate body to be plasma-processed, wherein an auxiliary electrode 107 is provided around the periphery of said electrode I 102 and a space 111 where a plasma can be excited is provided at the opposite side of said auxiliary electrode to, the face facing the electrode II 105, and said auxiliary electrode 107 has a high-frequency power applying means 109.

This embodiment uses a plasma etching apparatus of parallel plate type shown in FIG. 1, and has examined the self-bias potential and the plasma density distribution generated at the time of applying a high-frequency power (13.56 MHz) to electrode I, depending upon whether or not there is a plasma space under the auxiliary electrode.

Figure 2:
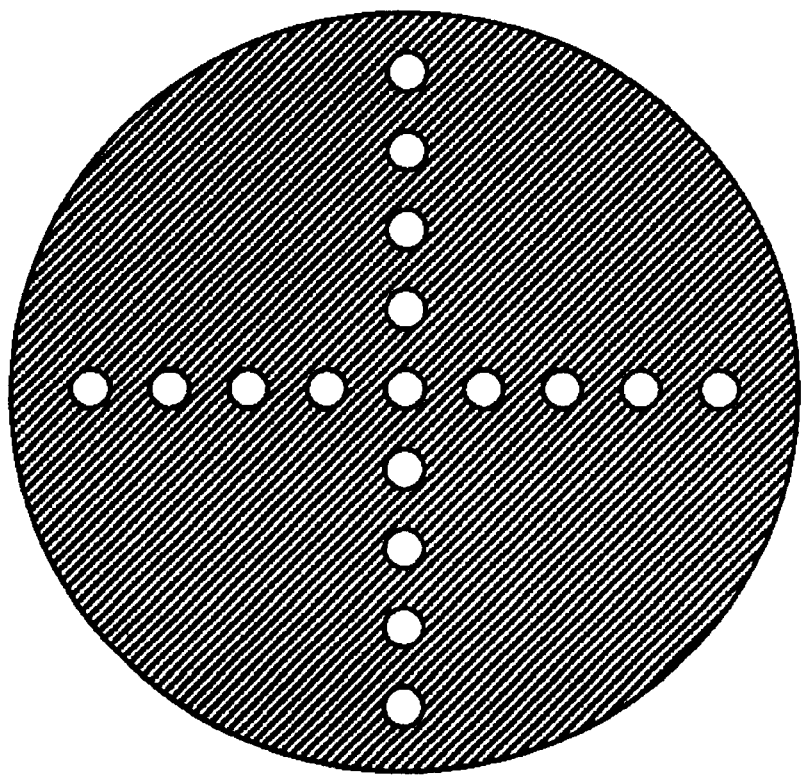
FIG. 2 is a plan view of electrode I according to embodiment 1 seen from the electrode II side.
Figure 3:
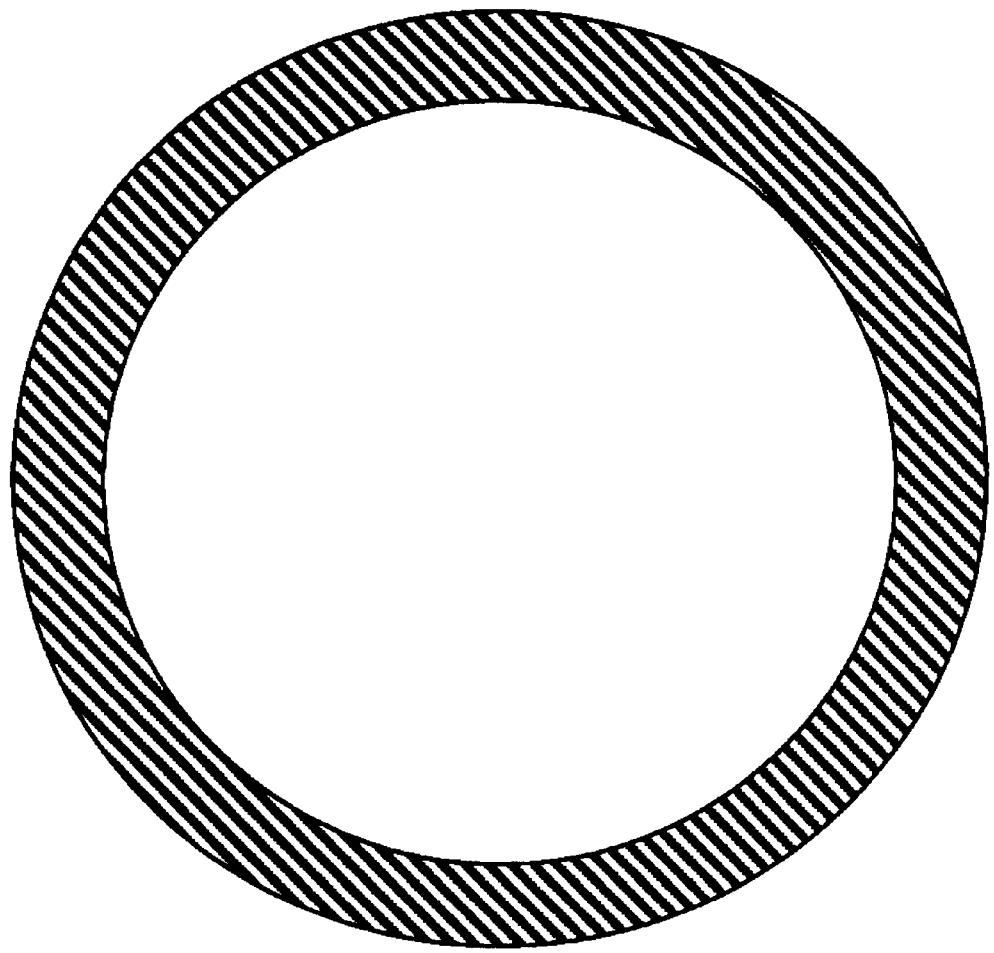
FIG. 3 is a plan view of the auxiliary electrode according to embodiment 1 seen from the electrode II side.

A chamber 100 shown in FIG. 1 is made of aluminum, and number 101 is an exhausting means, which depressurizes the inside of the chamber 100 by means of a turbo-molecular pump (STP1000, made by Seiko Seiki, Inc.). And the inside of the chamber 100 is kept at a desired pressure by introducing an argon gas into it through a gas introducing means 112. The electrode I 102 is connected to a high-frequency power source 104 of 13.56 MHz in frequency through a matching circuit 103. And the electrode II 105 is, grounded to the earth. And a probe 106 for measuring the self-bias potential and the ion current density of a plasma is provided in each of seventeen spots on the electrode I. FIG. 2 shows a top view of the electrode I 102. The auxiliary electrode 107 is connected through a matching circuit 108 to a high-frequency power source 109 of 13.56 MHz in frequency. A chamber 100 shown in FIG. 1 is made of aluminum, and number 101 is an exhausting means, which depressurizes the inside of the chamber 10 by means of a turbo-molecular pump (STP1000, made by Seiko Seiki, Inc.). And the inside of the chamber 100 is kept at a desired pressure by introducing an argon gas into it through a gas introducing means 112. The electrode I 102 is connected to a high-frequency power source 104 or 13.56 MHz in frequency through a matching circuit 103. And the electrode II 105 is grounded to the earth. And a probe 106 for measuring the self-bias potential and the ion current density of a plasma is provided in each of seventeen spots on the electrode I. FIG. 2 shows a top view of the electrode I 102. The auxiliary electrode 107 is connected through a matching circuit 108 to a high-frequency power source 109 of 13.56 MHz in frequency. FIG. 3 shows a top view of the auxiliary electrode 107 after 13.56 MHz in frequency. The auxiliary electrode 107 is structured so as to be detachable. Number 110 of FIG. 1 is a magnetic field applying means, which applies a parallel magnetic field of 120 gauss onto the electrode I 102. Number 111 is a space where a plasma can be excited. The auxiliary electrode 107 is structured so as to be detachable. Number 110 of FIG. 1 is a magnetic field applying means, which applies a parallel magnetic field of 120; gauss onto the electrode I 102. Number 111 is a space where a plasma can be excited.

Figure 4:
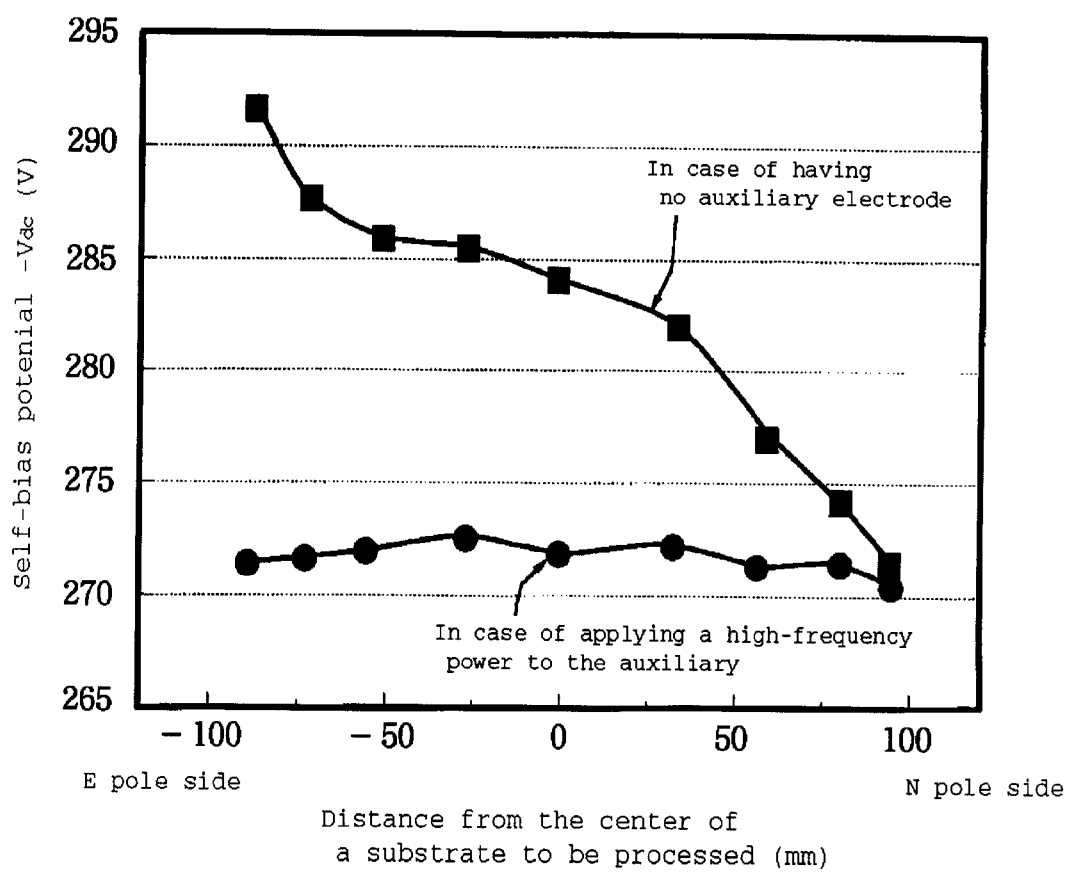
FIG. 4 is a graph of measurement of distribution of the self-bias potential of a plasma on electrode I according to embodiment 1.

FIG. 4 shows a result of measurement of the self-bias potential. It is understood that in case that the auxiliary electrode 107 is not provided and there is not a space 111 where a plasma can be excited, namely, in case of the same structure as a former plasma process apparatus, the self-bias potential at the E pole side on the electrode I is large to the negative side, but on the other hand in case that the auxiliary electrode 107 is provided and there is a space where a plasma can be excited, the self-bias potential at the E pole side on the electrode I becomes small and the self-bias potential is made uniform as a whole.

Figure 5:
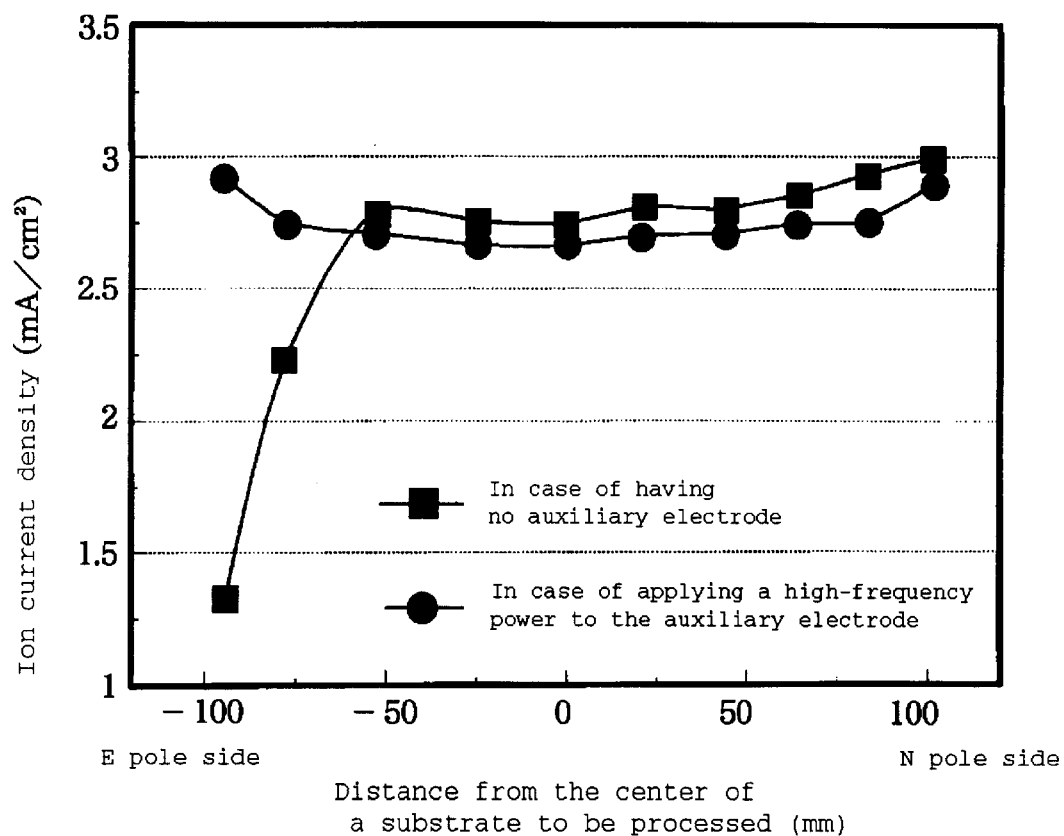
FIG. 5 is a graph of measurement of distribution of the ion current density of a plasma on electrode I according to embodiment 1.

FIG. 5 shows a result of measurement of a plasma density on the basis of an ion current density. In case that a plasma space is provided under the auxiliary electrode, it is possible to make uniform the plasma density which has been lowered at the E electrode side.

Embodiment 2

This embodiment has measured the plasma potential and the consumption of the electrode II in case of applying to the auxiliary electrode a high-frequency power being the same in frequency as and different by 180 degrees in phase from the high-frequency power (13.56 MHz) applied to the electrode I. This embodiment is the same as embodiment 1 in the other points.

Figure 6:
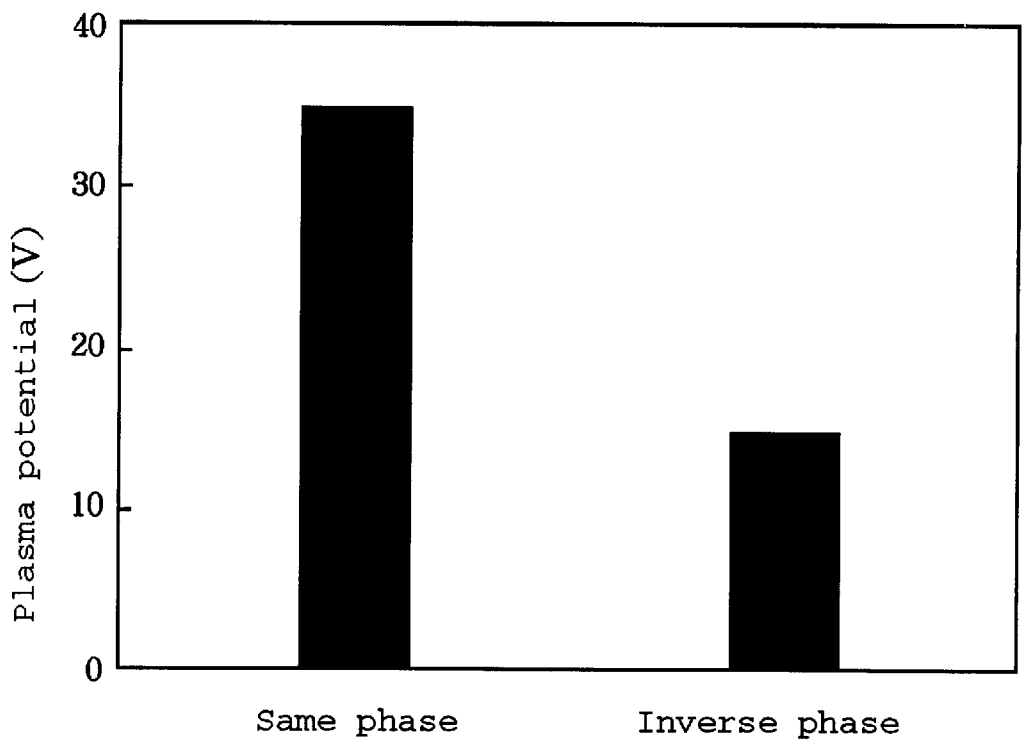
FIG. 6 is a graph of measurement of a plasma potential according to embodiment 2.

FIG. 6 shows the plasma potential in case of applying to the auxiliary electrode a high-frequency power of 13.56 MHz of the same or inverse phase. The plasma potential which is 35 V in case of applying a high-frequency power of the same phase can be lowered to 15 V by applying a high-frequency of the inverse phase.

Figure 7:
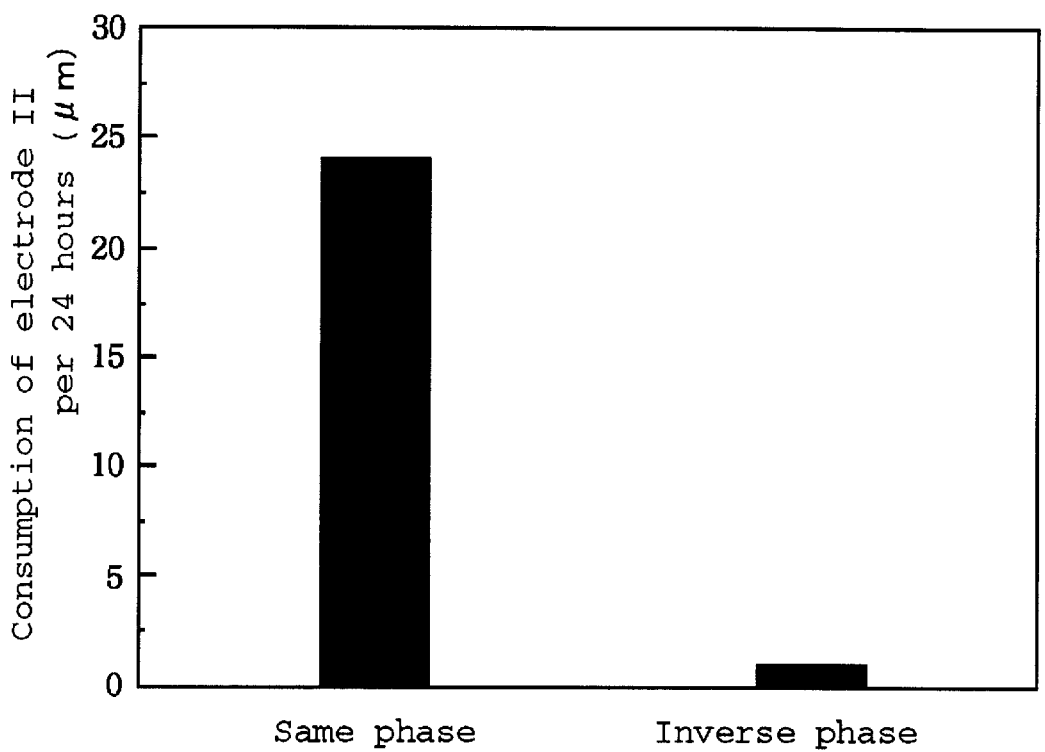
FIG. 7 is a graph of measurement of the consumption of electrode II according to embodiment 2.

FIG. 7 shows measurement of the consumption of electrode II caused by a sputtering effect of plasma. Variation in thickness of electrode II was measured after a plasma had been excited for twenty-four hours. The electrode II was decreased by 24 μm in thickness in case of applying a 13.56-MHz power of the same phase and was decreased by 1 μm in thickness in case of applying the 13.56-MHz power of the inverse phase.

From these results, it is possible to lower the plasma potential by applying to the auxiliary electrode a high-frequency power being inverse in phase to the electrode I, and thereby suppress the consumption of the electrode II or the vacuum container.

Embodiment 3

This embodiment has measured the consumption of the auxiliary electrode in case of applying to the auxiliary electrode a high-frequency power of a higher frequency (100 MHz) than the high-frequency power (13.56 MHz) applied to the electrode I.

This embodiment is the same as embodiment 2 in the other points.

Figure 8:
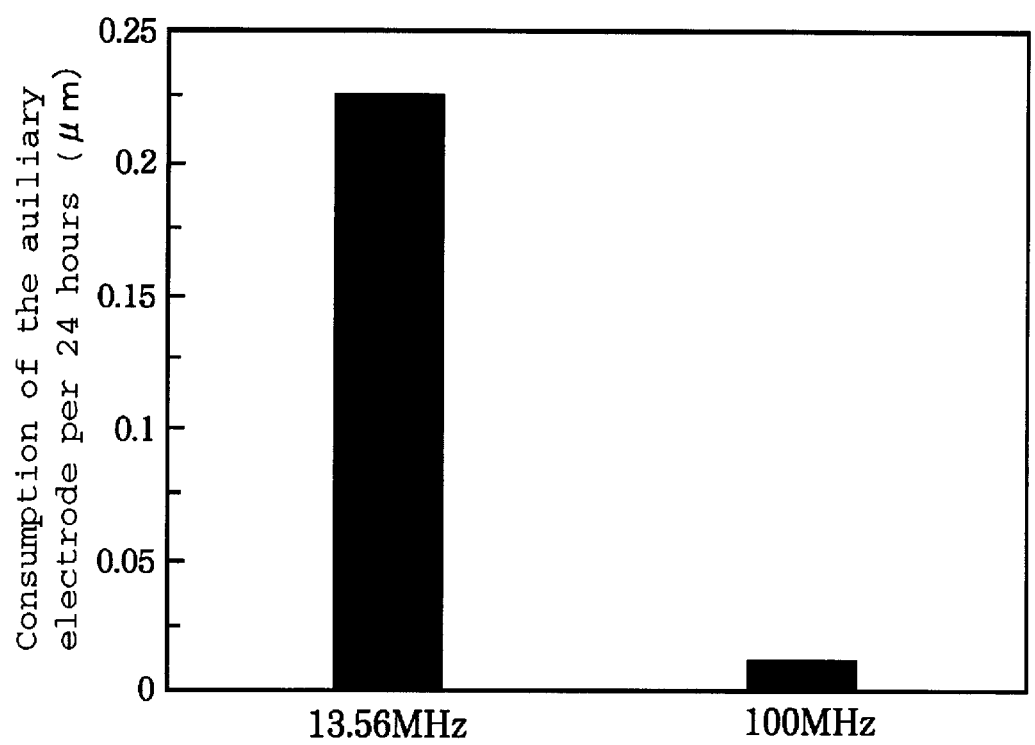
FIG. 8 is a graph of measurement of the consumption of an auxiliary electrode according to embodiment 3.

FIG. 8 shows measurement of the consumption of the auxiliary electrode caused by a sputtering effect of plasma in case of applying to the auxiliary electrode a high-frequency power of 13.56 MHz or a high-frequency power of 100 MHz.

Variation in thickness of the auxiliary electrode was measured after a plasma had been excited, for twenty-four hours. The auxiliary electrode was decreased by 0.225 mm in thickness in case of applying a high-frequency power of 13.56 MHz and was decreased by 0.011 mm in thickness in case of applying a 100 MHz power.

From these results, it is possible to suppress the consumption of the auxiliary electrode by applying too the auxiliary electrode a high-frequency power being sufficiently higher than the electrode I.

Embodiment 4

This embodiment is an example in which electrode I and an auxiliary electrode are electrically short-circuited to each other and a high-frequency power source to be connected to the auxiliary electrode is omitted.

Figure 9:
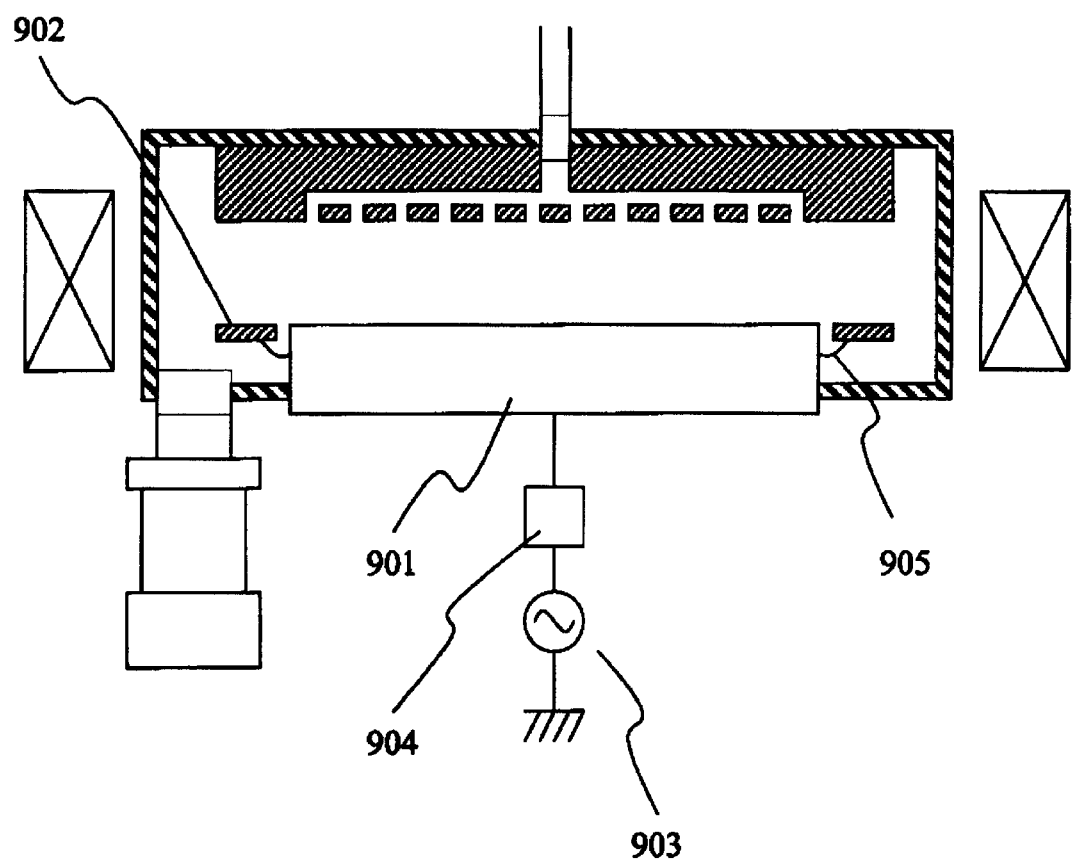
FIG. 9 is an example according to embodiment 4 in which electrode I and an auxiliary electrode are electrically short-circuited to each other and a high-frequency power source to be connected to the auxiliary electrode is omitted.

Number 901 shown in FIG. 9 is electrode I and 902 is an auxiliary electrode. Number 903 is a high-frequency power source, which is connected through a matching circuit 904 to the electrode I and the auxiliary electrode. Number 905 is a short-circuit plate, which is made of a material of aluminum or the like but is not limited to such a material. And it is a matter of course that the electrode I and the auxiliary electrode may be formed into one body.

This embodiment is the same as embodiment 1 in the other points.

Figure 10:
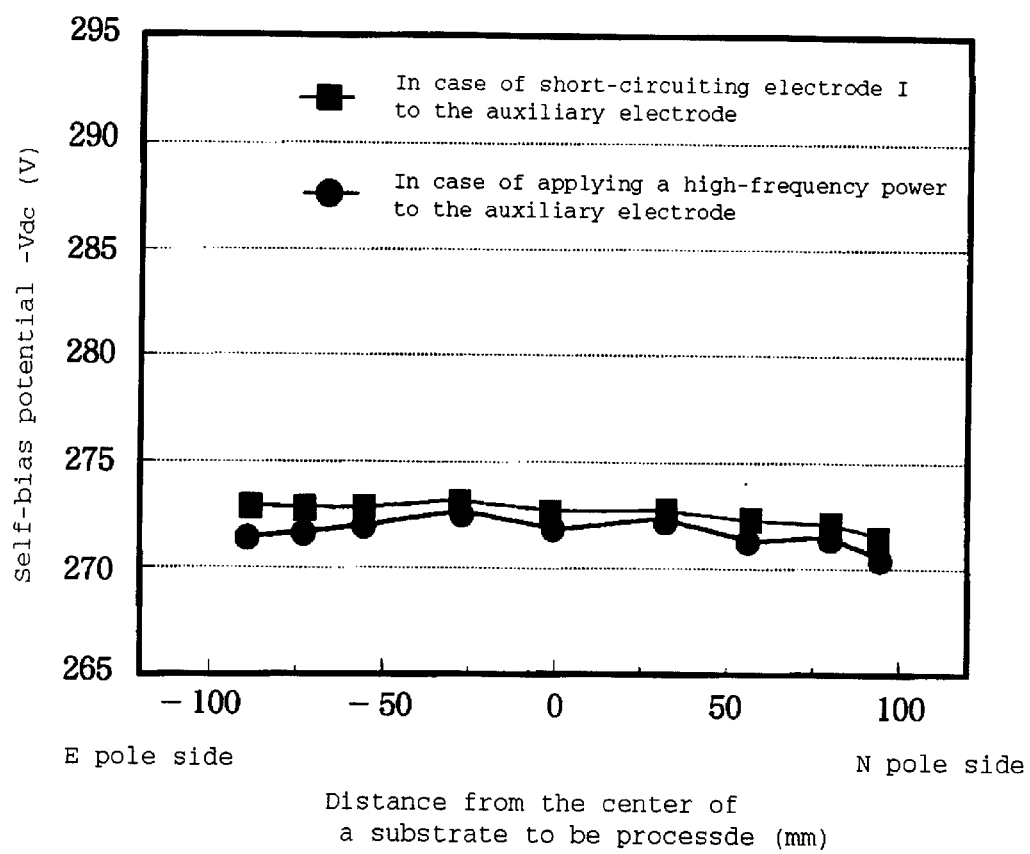
FIG. 10 is a graph of measurement of distribution of the self-bias potential of a plasma on electrode I according to embodiment 4.

FIG. 10 shows measurement of, the self-bias voltage distribution in case that the electrode I and the auxiliary electrode are electrically short-circuited to each other and a high-frequency power source to be connected to the auxiliary electrode is omitted or in case of applying a high-frequency power (13.56 MHz) to each of the electrode I and the auxiliary electrode. It is seen that both of these two cases have nearly equal results to each other. Since one of the high-frequency power sources can be omitted as obtaining a similar effect, it is possible to simplify the apparatus as a whole.

Embodiment 5

This embodiment shows a result of examination of the plasma density distribution in case that electrode I and an auxiliary electrode are electrically connected through a capacitor to each other and a high-frequency power source to be connected to the auxiliary electrode is omitted.

Figure 11:
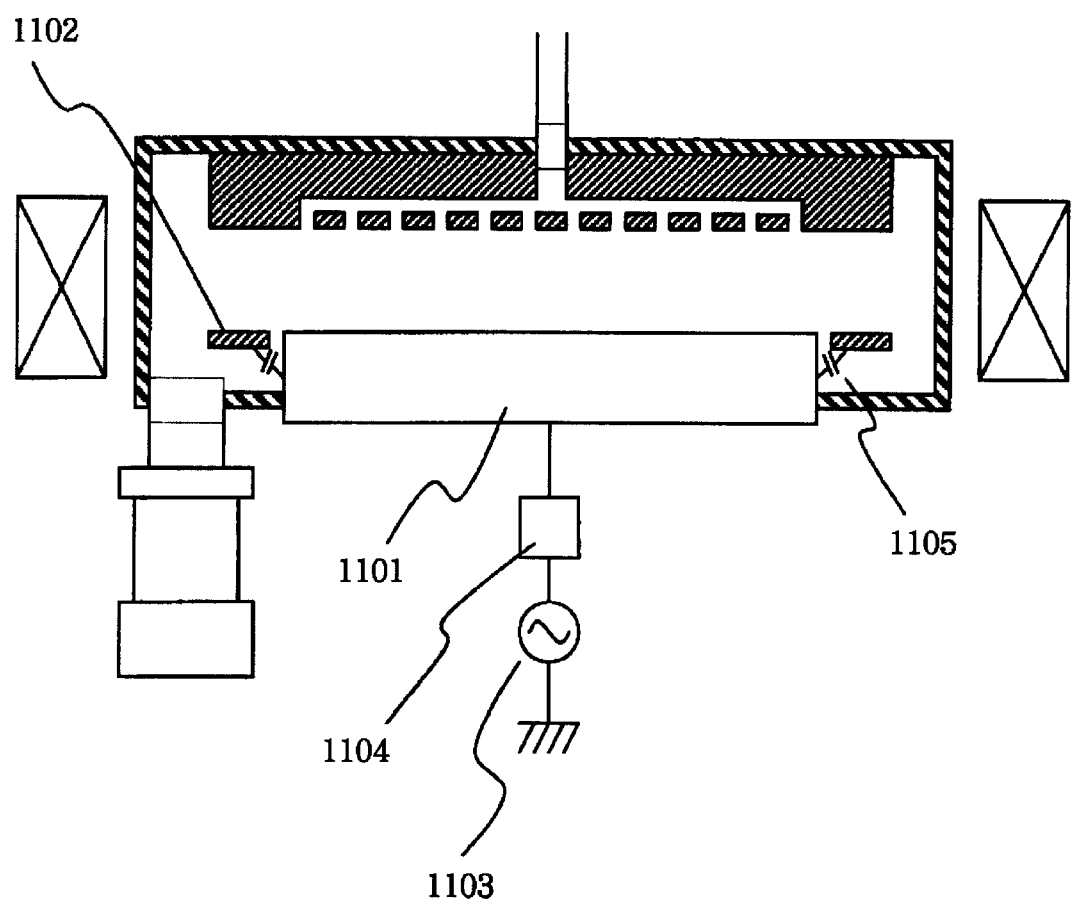
FIG. 11 is an example according to embodiment 5 in which electrode I and an auxiliary electrode are electrically coupled through a capacitor to each other and a high-frequency power source to be connected to the auxiliary electrode is omitted.

In FIG. 11, number 1101 is electrode I and 1102 is an auxiliary electrode. Number 1103 is a high-frequency power source, which is connected through a matching circuit 1104 to the electrode I. Number 1105 is a capacitor, which is provided between the electrode I and the auxiliary electrode. This embodiment is the same as embodiment 1 in the other points.

Figure 12:
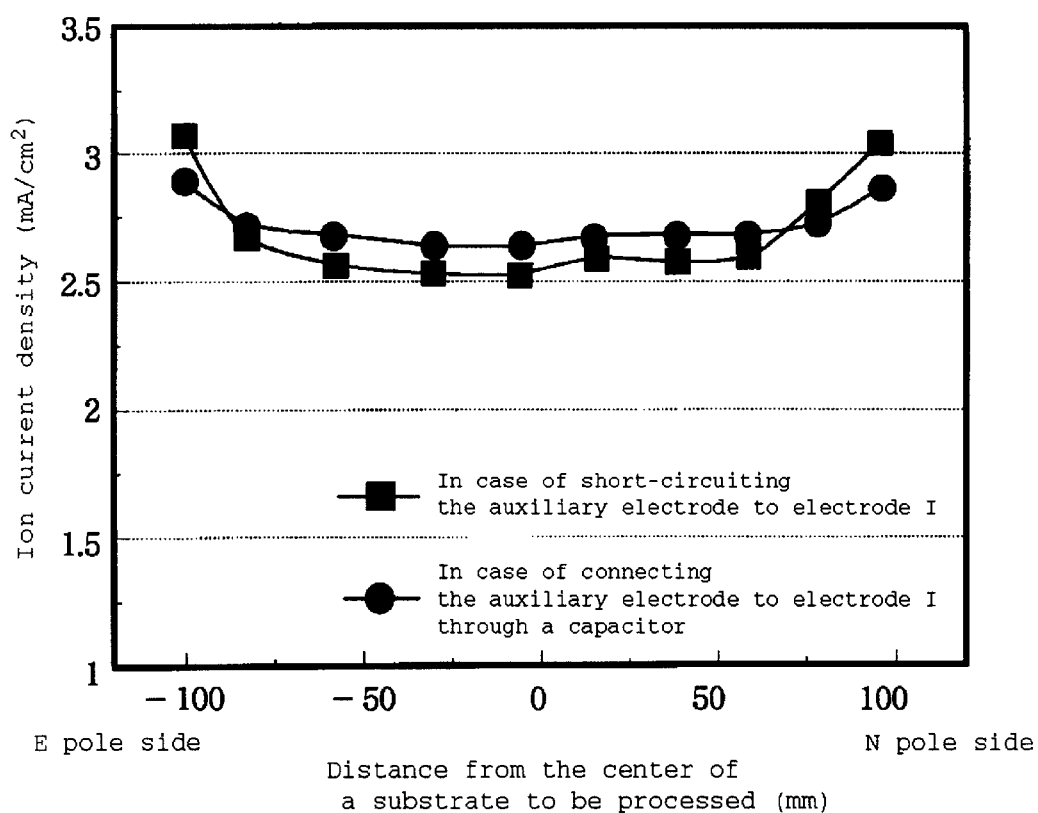
FIG. 12 is a graph of measurement of distribution of the ion current density of a plasma on electrode I according to embodiment 5.

FIG. 12 shows a result of measurement of the plasma density by means of ion current in case that the electrode I and the auxiliary electrode are connected through a capacitor (20 pF) to each other or in case that they are short-circuited to each other.

From this result, it is seen that the case of capacitor connection can make the plasma density more uniform than the case of short circuit.

Embodiment 6

This embodiment has examined the high-frequency power to be applied to an auxiliary electrode, said high-frequency power being capable of making the self-bias potential most uniform in case of making the lower surface of the auxiliary electrode be in parallel with a magnetic field to be introduced.

Figure 13:
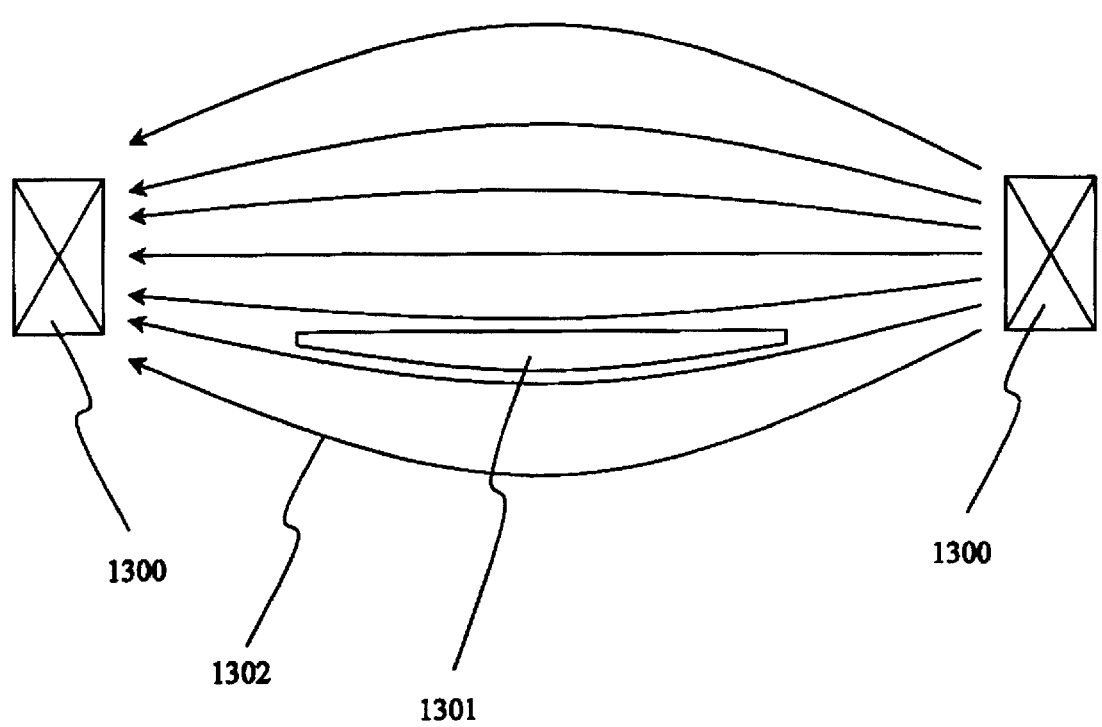
FIG. 13 is a side view of an auxiliary electrode according to embodiment 6.

FIG. 13 is a side view of the auxiliary electrode. Number 1300 is a magnetic field applying means and 1301 is an auxiliary, electrode, and 1302 shows magnetic lines of force in a magnetic field applied by the magnetic field applying means.

This embodiment is the same as embodiment 1 in the other points.

Figure 14:
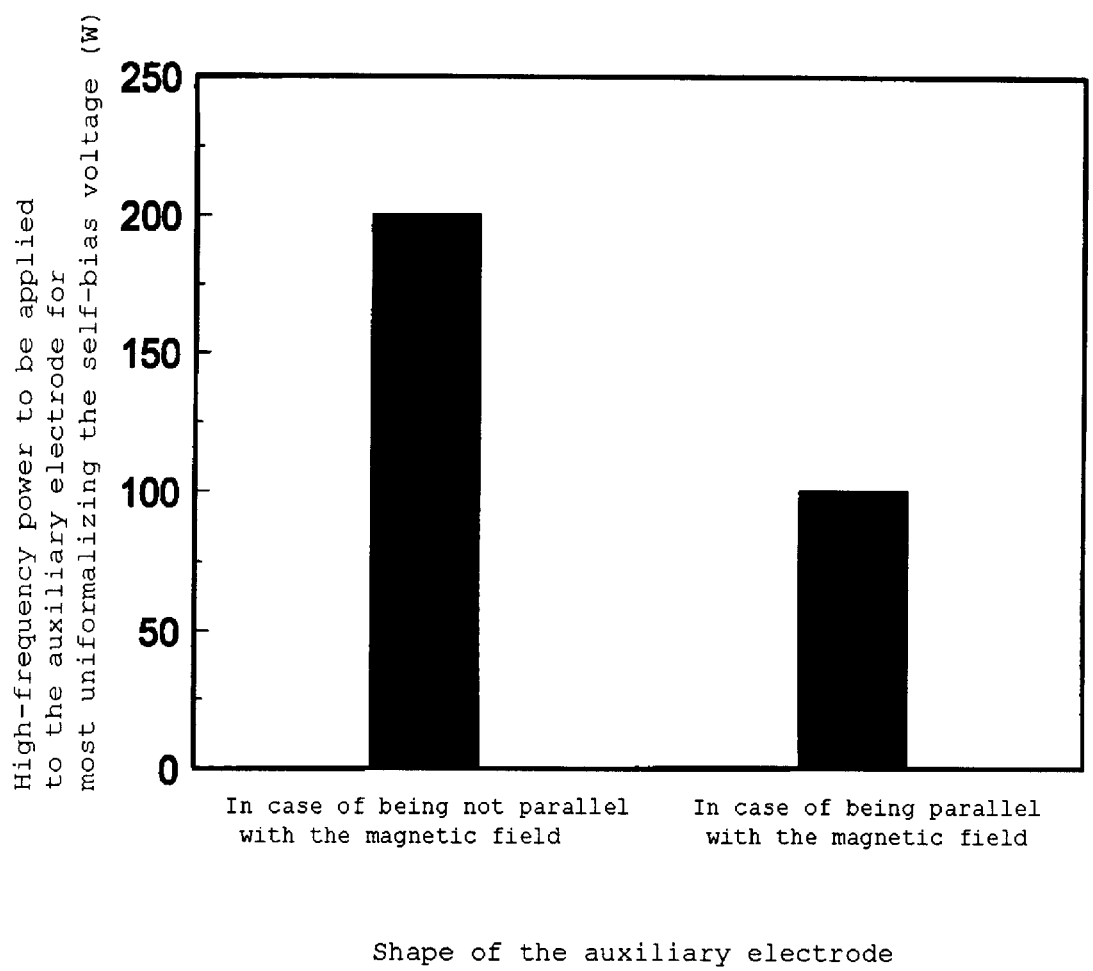
FIG. 14 is a graph of measurement of a high-frequency power to be applied to an auxiliary electrode capable of making distribution of the self-bias potential be the most uniform according to embodiment 6.

FIG. 14 shows examination of the high-frequency power to be applied to the auxiliary electrode, said high-frequency power being capable of making the self-bias potential most uniform, in case of making the lower surface of the auxiliary electrode parallel with a magnetic field to be introduced or in case of making the lower surface of the auxiliary electrode nonparallel with a magnetic field to be introduced.

While a high-frequency power to be applied to the auxiliary electrode which can make the self-bias potential uniform was 200 W in case of being nonparallel with the magnetic field, the high-frequency power was 100 W in case of being parallel with the magnetic field. It is possible to make the self-bias potential uniform by means of a small high-frequency power by making the lower surface of the auxiliary electrode parallel with the magnetic field.

Embodiment 7

Figure 15:
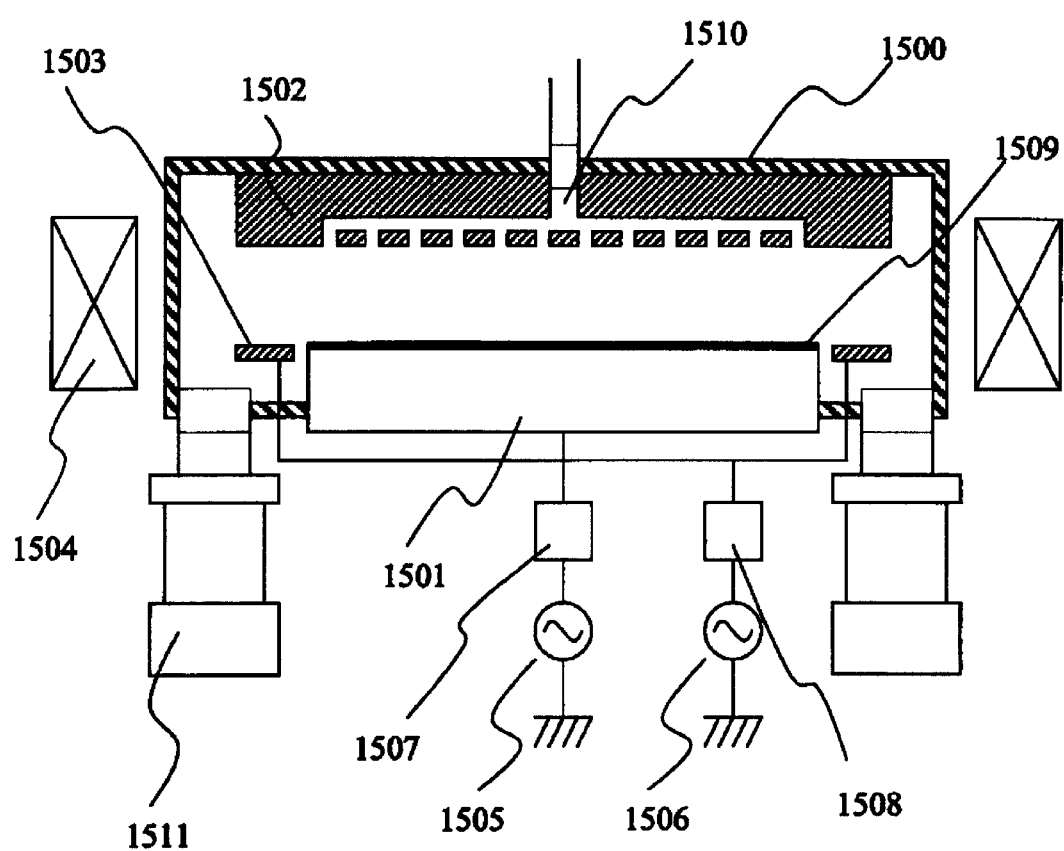
FIG. 15 is a schematic sectional view showing an example of a plasma etching apparatus according to embodiment 7.

FIG. 15 is a schematic sectional view showing an example of applying a plasma process apparatus of the present invention to a plasma etching apparatus.

In FIG. 15, number 1500 is a chamber, 1501 is an electrode I, 1502 is an electrode II, 1503 is an auxiliary electrode, 1504 is a magnetic field applying means, 1505 and 1506 are high-frequency power sources, 1507 and 1508 are matching circuits, 1509 is a substrate to be processed, 1510 is a mechanism built in the electrode II for introducing a process gas, and 1511 is an exhausting means. The chamber 1500 and the electrode II 1502 are made of aluminum, each of their surfaces has aluminum fluoride formed on it as a protective film by performing a fluorinating process, but they are not limited to the combination of these materials.

The chamber 1500 functions as a decompression container by means of the exhausting means 1511. As a material for the auxiliary electrode 1503, silicon carbide was used but a conductive material such as aluminum or the like and such a material having an insulating film formed on its surface may be used. As the magnetic field applying means 1504, a dipole ring magnet having a uniform magnetic field of 120 gauss was used.

The high-frequency power source 1505 is a high-frequency power source of 13.56 MHz and is connected through the matching circuit 1507 to the electrode I 1501. The high-frequency power source 1506 also is a high-frequency power source of 13.56 MHz but is connected through the matching circuit 1508 to the auxiliary electrode, 1502 so as to be inverse in phase to and synchronous with the high-frequency power source 1505.

The substrate to be processed 1509 is a silicon wafer and has a silicon oxide film and a patterned resist formed on its surface.

Number 1510 is a means for introducing a process gas and is formed into a structure called a shower plate, provided with a number of small holes so as to introduce a process gas uniformly onto the substrate to be processed 1509. And as a process gas, a mixed gas of xenon, tetracarbon octofluoride, carbon monoxide, and oxygen was used. And the flow of the gas was set so that the pressure inside the chamber is 30 mTorr. The exhausting means 1511 used three screw molecular pumps (DMS300, made by Daikin Industries, Ltd.) so as to decompress the inside of the chamber 1500.

Figure 16:
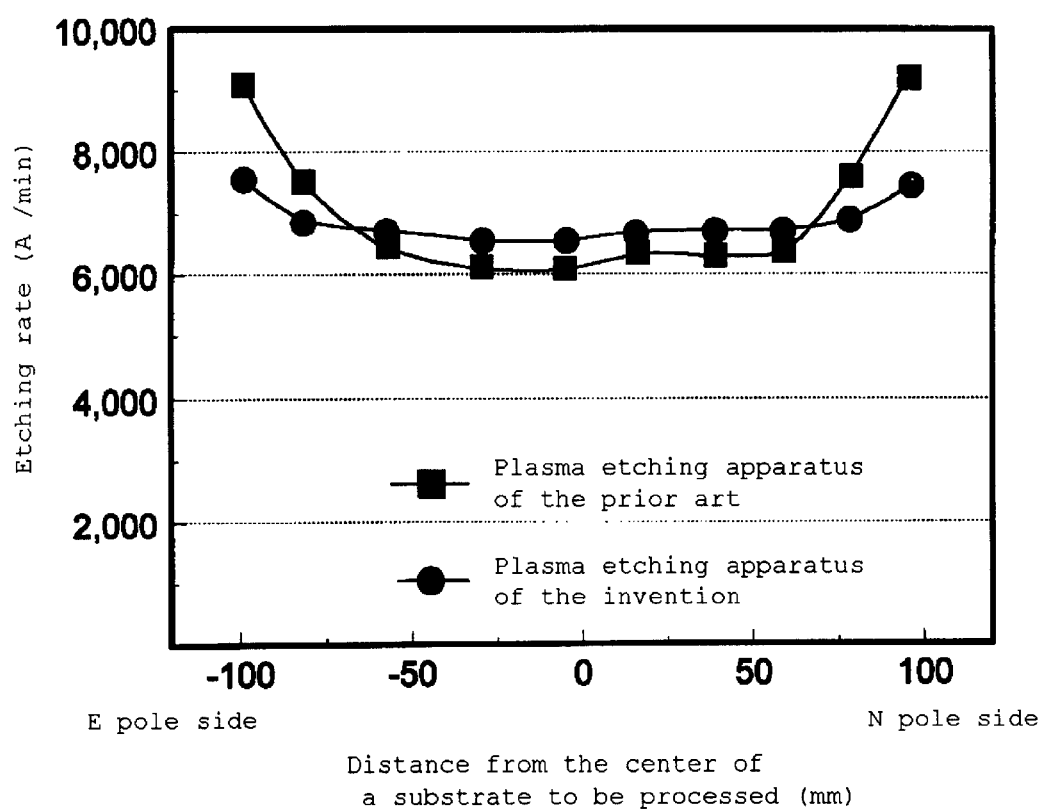
FIG. 16 is a graph of measurement of the etching rate of a silicon oxide film according to embodiment 7.

FIG. 16 shows distribution of the etching rate of a silicon oxide film on the surface of the substrate to be processed in case of using a plasma etching apparatus of this embodiment. Although there is a thickness difference of about 1000 Å between the central part and the peripheral part of a processed substrate in case of a former plasma etching apparatus, a thickness difference was little perceived in case of the present invention.

Embodiment 8

Figure 17:
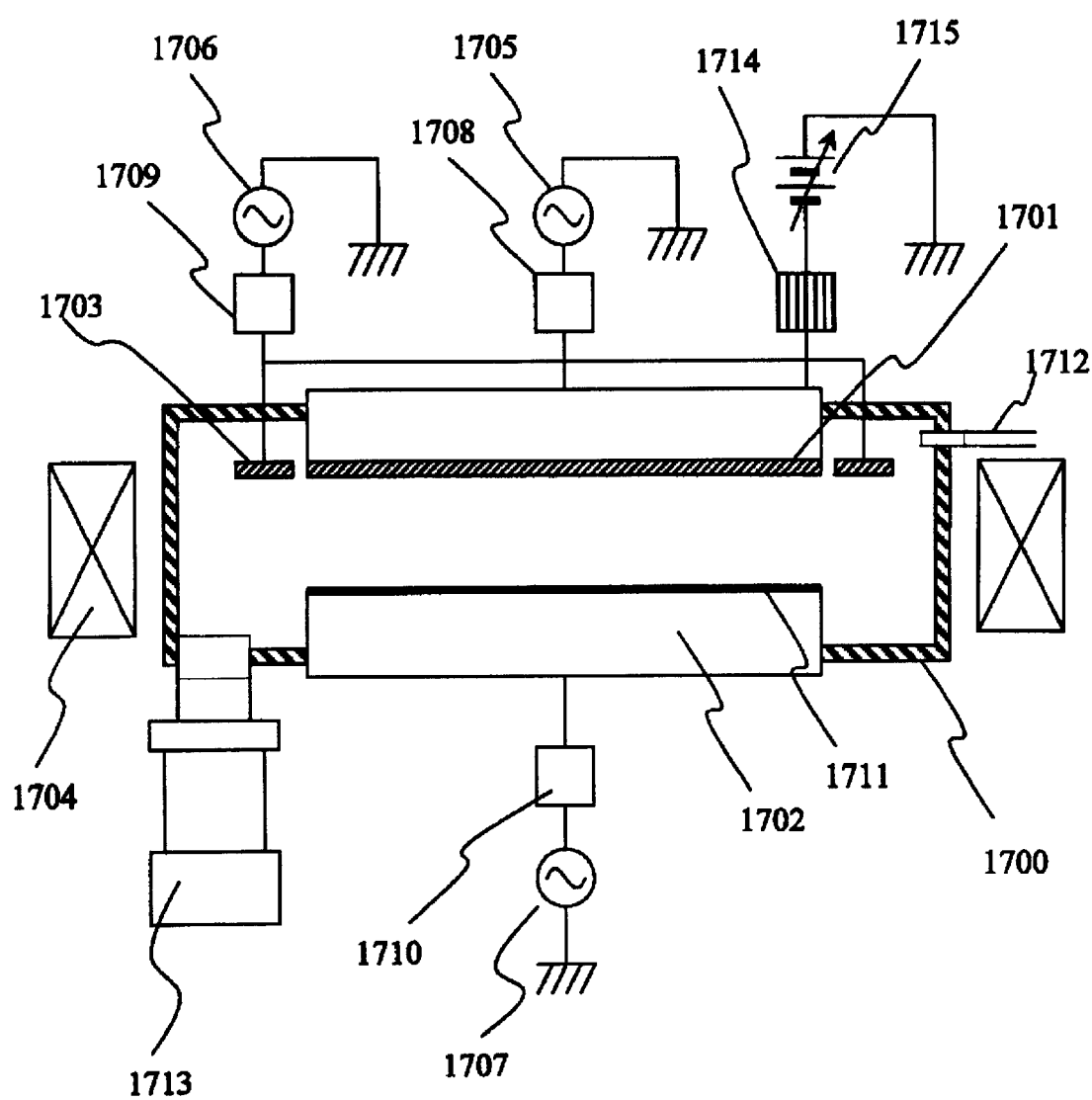
FIG. 17 is a schematic sectional view showing an example of a sputtering apparatus according to embodiment 8.

FIG. 17 is a schematic sectional view showing an example of applying a plasma process apparatus of the present invention to a sputtering apparatus.

In FIG. 17, number 1700 is a chamber, 1701 is an electrode I, 1702 is an electrode II, 1703 is an auxiliary electrode, 1704 is a magnetic field applying means, 1705, 1706 and 1707 are high-frequency power sources, 1708, 1709 and 1710 are matching circuits, 1711 is a substrate body to be processed, 1712 is a mechanism for introducing a process gas, 1713 is an exhausting means, 1714 is a direct current power source, and 1715 is a low-pass filter.

The chamber 1700 is made of aluminum, the surface of which has aluminum fluoride formed on it as a protective film by performing a fluorinating process, and it is not limited to the combination of these materials but is preferably a material discharging as little as possible such gases as water vapor and the like other than a process gas. The chamber 1700 functions as a decompression container by means of the exhausting means 1713.

The electrode I 1701 is made of a target material, and tantalum is used in this embodiment and a material for forming a film on the surface of the substrate to be processed 1711. The electrode I 1702 is mounted with the substrate to be processed 1711 on it. As a material for the auxiliary electrode 1703, tantalum was used. A conductive material such as aluminum or the like and such a material having an insulating film formed on its surface may be used, but the same material as the electrode I 1701 is preferable.

As the magnetic field applying means 1704, a dipole ring magnet of 120 gauss was used. The high-frequency power source 1705 is a high-frequency power source of 40 MHz and is connected through the matching circuit 1708 to the electrode I 1701. The high-frequency power source 1706 also is a high-frequency power source of 40 MHz but is connected through the matching circuit 1709 to the auxiliary electrode 1703 so as to be inverse in phase to and synchronous with the high-frequency power source 1705. And the high-frequency power source 1707 is a high-frequency power source of 13.56 MHz and is connected through the matching circuit 1710 to the electrode II 1702. The direct current power source 1714 is connected through the low-pass filter 1715 to the electrode I.

The substrate to be processed 1711 is a silicon wafer and has a silicon oxide film formed on its surface.

Number 1712 is a means for introducing a process gas and used a xenon gas.

The flow of the gas was set so that the pressure inside the chamber is 10 mTorr. The exhausting means 1713 used a turbo-molecular pump (STP2200, made by Seiko Seiki) so as to decompress the inside of the chamber 1700.

What is claimed is:

1. A plasma process apparatus, wherein:

two parallel plate electrodes I and II are provided, one of said electrode I and said electrode II being configured for carrying a substrate to be plasma processed, only one of said electrode I and said electrode II has an additional operating electrode associated therewith, said additional electrode being an auxiliary electrode, said auxiliary electrode being positioned around the periphery of said one of said electrode I and said electrode II, a magnetic field applying means for applying a magnetic field is provided, said magnetic field being horizontal and one-directional to a surface of the substrate to be plasma processed, said magnetic field applying means being a single magnetic source, a space where a plasma can be excited is provided on the side of said auxiliary electrode opposite said other one of said electrode I and said electrode II, and a means for applying a high-frequency power to said auxiliary electrode is provided.

2. A plasma process apparatus according to claim 1, wherein;

a high-frequency power of frequency f1 connected to said electrode I and a high-frequency power of frequency f2 to be applied to said auxiliary electrode are the same in frequency as and inverse in phase to each other.

3. A plasma process apparatus according to claim 1, wherein;

a high-frequency power of frequency $f_1$ connected to said electrode I and a high-frequency power of frequency $f_2$ meeting "$f_2 \gg f_1$" are applied to said auxiliary electrode.

4. A plasma process apparatus according to claim 1, wherein;

said electrode I and said auxiliary electrode are electrically short-circuited to each other.

5. A plasma process apparatus according to claim 1, wherein;

said electrode I and said auxiliary electrode are electrically coupled through a capacitor to each other.

6. A plasma process apparatus according to claim 1, wherein;

a bottom surface of said auxiliary electrode is in parallel with a magnetic field introduced by said magnetic field applying means.

7. A plasma process apparatus according to claim 1, wherein;

said magnetic field applying means is a dipole ring magnet.

8. A three-electrode plasma process apparatus, comprising:

two parallel plate electrodes I and II, one of said electrode I and said electrode II being configured for carrying a substrate to be plasma processed;

a magnetic field applying means for applying a magnetic field horizontal and one-directional to a surface of the substrate to be processed, said magnetic field applying means being a single magnetic source;

a single auxiliary electrode, said auxiliary electrode being positioned around the periphery of said electrode I;

a space where a plasma can be excited, said space being provided on the side of said auxiliary electrode opposite said electrode II; and a means for applying a high-frequency power to said auxiliary electrode.

9. A plasma process apparatus, wherein:

two parallel plate electrodes I and II are provided, one of said electrode I and said electrode II being configured for carrying a substrate to be plasma processed, said electrode I is a substrate support electrode, said electrode I being configured for carrying a substrate to be plasma processed, said electrode II is in a form of a showerhead electrode, a single auxiliary electrode is provided, said auxiliary electrode being positioned a round the periphery of said electrode I, a magnetic field applying means for applying a magnetic field is provided, said magnetic field being horizontal and one-directional to a surface of the substrate to be processed, said magnetic field applying means being a single magnetic source, a space where a plasma can be excited is provided on the side of said auxiliary electrode opposite said electrode II, and a means for applying a high-frequency power to said auxiliary electrode is provided.

* * * * *